(12) United States Patent
Dooley et al.

(10) Patent No.: US 9,169,742 B2
(45) Date of Patent: Oct. 27, 2015

(54) ELECTRONIC SHAFT SHEAR DETECTION CONDITIONING CIRCUIT

(75) Inventors: Kevin Allan Dooley, Mississauga (CA); Antwan Shenouda, Mississauga (CA)

(73) Assignee: PRATT & WHITNEY CANADA CORP., Longueuil, CA (US)

( * ) Notice: Subject to any disclaimer, the term of this patent is extended or adjusted under 35 U.S.C. 154(b) by 834 days.

(21) Appl. No.: 12/714,263

(22) Filed: Feb. 26, 2010

(65) Prior Publication Data

US 2011/0213537 A1   Sep. 1, 2011

(51) Int. Cl.
| G06F 19/00 | (2011.01) |
| G06G 7/70 | (2006.01) |
| F01D 21/04 | (2006.01) |
| G01R 31/28 | (2006.01) |
| G01R 31/34 | (2006.01) |

(52) U.S. Cl.
CPC .......... F01D 21/045 (2013.01); *F05D 2260/80* (2013.01); *G01R 31/2829* (2013.01); *G01R 31/2831* (2013.01); *G01R 31/2853* (2013.01); *G01R 31/2856* (2013.01); *G01R 31/343* (2013.01)

(58) Field of Classification Search
CPC ... F01D 21/045; F05D 2260/80; G01R 31/02; G01R 31/343; G01R 31/2829; G01R 31/2831; G01R 31/2853; G01R 31/2856; G01R 31/31905; F02C 9/46
USPC ................ 701/29.1–34.4, 100; 702/33, 58; 415/14; 73/1.5
See application file for complete search history.

(56) References Cited

U.S. PATENT DOCUMENTS

| 3,394,581 A | 6/1968 | Johnson |
| 3,641,550 A | 2/1972 | Lynas et al. |
| 3,852,958 A | 12/1974 | Adams et al. |
| 4,162,491 A | 7/1979 | Gochis |
| 4,545,198 A | 10/1985 | Yoshida |
| 4,591,794 A | 5/1986 | Shattuck et al. |

(Continued)

FOREIGN PATENT DOCUMENTS

CA    1103309    6/1981

OTHER PUBLICATIONS

Canadian Intellectual Property Office; Response to Examiners Requisition dated Mar. 26, 2012.

(Continued)

*Primary Examiner* — Jason Holloway
*Assistant Examiner* — Rachid Bendidi
(74) *Attorney, Agent, or Firm* — Norton Rose Fulbright Canada LLP

(57) ABSTRACT

An electrical control system for distinguishing between an electrical fault and a shaft shear condition in a gas turbine engine, the control system including, in one aspect, a detection circuit including: two or more probes, each probe including an associated resistor having a predetermined range of resistance, and each probe being disposed in the engine adjacent a rotary mounted shaft component, where mechanical interference between one or more of the probes and the shaft component renders the associated resistor substantially nonconductive; sensor processor(s) in communication with each probe, determining a probe operational status based on a measured resistance to current conducted through each probe, and generating a fault code when the measured resistance of at least one of the plurality of probes is not within the predetermined range of resistance.

20 Claims, 6 Drawing Sheets

(56) References Cited

U.S. PATENT DOCUMENTS

| | | | |
|---|---|---|---|
| 4,620,446 A | 11/1986 | Jensen et al. | |
| 4,712,372 A | 12/1987 | Dickey et al. | |
| 4,737,709 A | 4/1988 | Loftus | |
| 4,833,405 A | 5/1989 | Richards et al. | |
| 5,411,364 A | 5/1995 | Aberg et al. | |
| 5,757,151 A * | 5/1998 | Donegan et al. | 318/150 |
| 6,176,074 B1 | 1/2001 | Thompson et al. | |
| 6,293,085 B2 | 9/2001 | Thompson et al. | |
| 6,607,349 B2 * | 8/2003 | Mulera et al. | 415/1 |
| 6,717,420 B2 * | 4/2004 | Eyraud et al. | 324/701 |
| 6,756,908 B2 | 6/2004 | Gass et al. | |
| 7,002,172 B2 | 2/2006 | Rensch | |
| 7,100,354 B2 * | 9/2006 | Opper | 60/39.091 |
| 7,392,713 B2 | 7/2008 | Barkhoudarian | |
| 7,432,818 B2 * | 10/2008 | Ray | 340/635 |
| 7,443,642 B2 * | 10/2008 | Dooley | 361/23 |
| 7,511,516 B2 * | 3/2009 | Nigmatulin et al. | 324/699 |
| 7,758,301 B2 | 7/2010 | Bilson et al. | |
| 7,780,400 B2 * | 8/2010 | Bilson | 415/9 |
| 7,787,970 B2 * | 8/2010 | Strasser et al. | 700/56 |
| 2003/0230466 A1 * | 12/2003 | Swinderman et al. | 198/497 |
| 2007/0241921 A1 * | 10/2007 | Arguello et al. | 340/679 |
| 2007/0285110 A1 | 12/2007 | Nigmatulin et al. | |
| 2009/0071442 A1 * | 3/2009 | Emo et al. | 123/446 |
| 2010/0219987 A1 | 9/2010 | Isom et al. | |

OTHER PUBLICATIONS

Canadian Intellectual Property Office; Examiner's Requisition dated Mar. 26 2012.
Canadian Intellectual Property Office; Examiners Requisition dated Jan. 30, 2013.
Canadian Intellectual Property Office; Examiners Requisition dated Nov. 28, 2013.
Canadian Intellectual Property Office; Response to Examiners Requisition dated Nov. 28, 2013.

* cited by examiner

| States | Annunciators | | | | Probes | | Condition | Action |
|---|---|---|---|---|---|---|---|---|
| | Opto 1 | Opto 2 | Opto 3 | Opto 4 | Sensor 1 | Sensor 2 | | |
| 0 | 0 | 0 | 0 | 0 | - | - | Circuit Damage Both Sides | SHUTDOWN |
| 1 | 0 | 0 | 0 | 1 | - | O | Circuit Damage and Possible Detection | SHUTDOWN |
| 2 | 0 | 0 | 1 | 0 | - | S | Circuit Damage and Sensor Failure | SHUTDOWN |
| 3 | 0 | 0 | 1 | 1 | - | R | Circuit Damage Single Side | WARNING |
| 4 | 0 | 1 | 0 | 0 | O | - | Circuit Damage and Possible Detection | SHUTDOWN |
| 5 | 0 | 1 | 0 | 1 | O | O | Shaft Shear | SHUTDOWN |
| 6 | 0 | 1 | 1 | 0 | O | S | Sensor Failure and Possible Detection | SHUTDOWN |
| 7 | 0 | 1 | 1 | 1 | O | R | Sensor Failure Single Side | WARNING |
| 8 | 1 | 0 | 0 | 0 | S | - | Circuit Damage and Sensor Failure | SHUTDOWN |
| 9 | 1 | 0 | 0 | 1 | S | O | Sensor Failure and Possible Detection | SHUTDOWN |
| 10 | 1 | 0 | 1 | 0 | S | S | Sensor Failure Both Sides | SHUTDOWN |
| 11 | 1 | 0 | 1 | 1 | S | R | Sensor Failure Single Side | WARNING |
| 12 | 1 | 1 | 0 | 0 | R | - | Circuit Damage Single Side | WARNING |
| 13 | 1 | 1 | 0 | 1 | R | O | Sensor Failure Single Side | WARNING |
| 14 | 1 | 1 | 1 | 0 | R | S | Sensor Failure Single Side | WARNING |
| 15 | 1 | 1 | 1 | 1 | R | R | GOOD | GOOD |

States 0–14: Fault Codes
State 15: No Fault

Opto isolator
- 0  OFF
- 1  ON

- - Circuit Damage
- O - Open - Detection of Shaft Shear or Sensor Failure
- S - Short - Sensor Failure
- R - Resistance - Sensor in Good Condition

Fig. 2

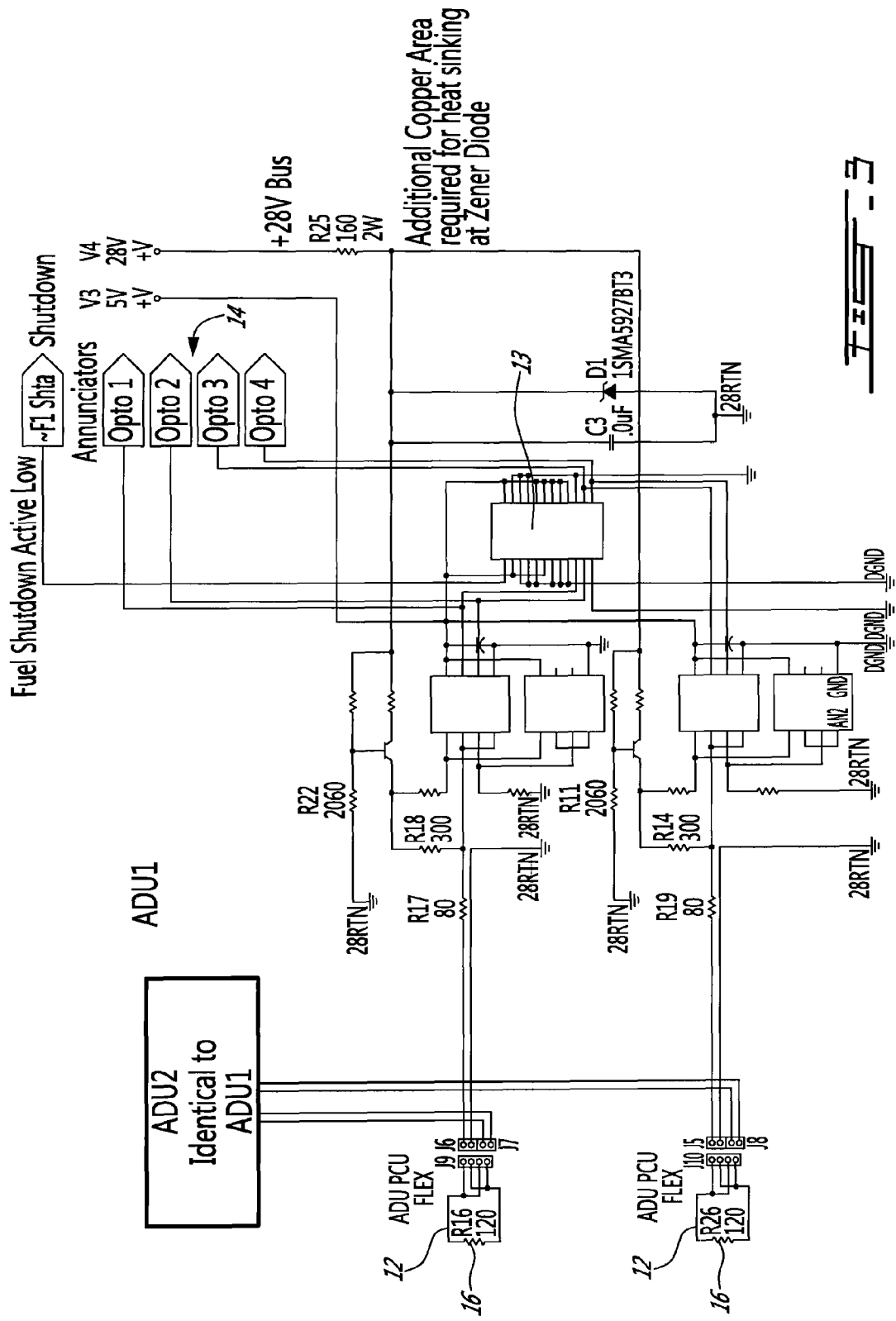

ELECTRONIC SHAFT SHEAR DETECTION CONDITIONING CIRCUIT

TECHNICAL FIELD

The disclosure relates to an electrical control system for distinguishing between an electrical fault and a shaft shear condition in a gas turbine engine.

INCORPORATION BY REFERENCE

The entirety of U.S. Pat. No. 7,443,642, Electric Motor Control, of Kevin A. Dooley, is incorporated herein by this reference.

BACKGROUND

Shaft shear in a gas turbine engine is a potentially catastrophic condition where, for example, the low pressure shaft has broken, the shaft portions continue rotating and the aft portion is driven aftward due to gas flow over the low pressure turbine. Rapid engine shutdown is required and specifically the fuel supply to the engine must be terminated immediately to prevent the resulting unloaded turbine from accelerating up to the turbine burst speed.

To detect shaft shear conditions by, for example, subsequent axial motion of the shaft to the aft position, sensors or probes are positioned in the engine adjacent the rear end of the shaft. When the shaft collides with the sensors, electronic controls generate a signal that results in fuel supply termination and engine shutdown.

Since the shaft shear condition and complete loss of engine operation are potentially catastrophic to the engine and aircraft, multiple sensors are installed to provide the necessary redundancy and reliability.

However any electronic sensor can malfunction due to internal damage, or the circuit connected to the sensor may be faulty. The sensors are housed in the engine core surrounded by the hot gas path, subjected to vibration and adjacent rotary components operating at high speed.

Therefore there is a need for reliable sensor operation which can properly detect shaft shear while minimizing false alarms.

Features that distinguish the present disclosure from the background art will be apparent from review of the disclosure, drawings and description of the disclosure presented below.

SUMMARY OF DISCLOSURE

The disclosure provides an electrical control system for distinguishing between an electrical fault and a shaft shear condition in a gas turbine engine. The control system includes a detection circuit with two or more probes, and each probe includes an associated resistor having a predetermined range of resistance. Each probe is disposed in the engine adjacent a rotary mounted shaft component, such as the shaft itself and/or any bearings or supporting members, etc.; and mechanical interference between one or more of the probes and the shaft component renders the associated resistor substantially non-conductive. For example, during a shaft shear breakage, axial movement of the shaft typically results in collision with a probe breaks electrical contact with the resistor. A sensor processor in communication with each probe determines a probe operational status based on a measured resistance to current conducted through each probe, and generates a fault code when the measured resistance of at least one of the probes is not within the predetermined range of resistance.

DESCRIPTION OF THE DRAWINGS

In order that the disclosure may be readily understood, embodiments of various aspects of the invention are illustrated by way of example in the accompanying drawings.

FIG. 2 is a table summarizing the possible conditions and fault codes resulting from use of two sensor probes.

FIG. 3 is a schematic circuit diagram showing two probes, a processor and four opto-isolator annunciators.

Further details of the invention and its advantages will be apparent from the detailed description included below.

DESCRIPTION OF EMBODIMENTS

Figure 1:
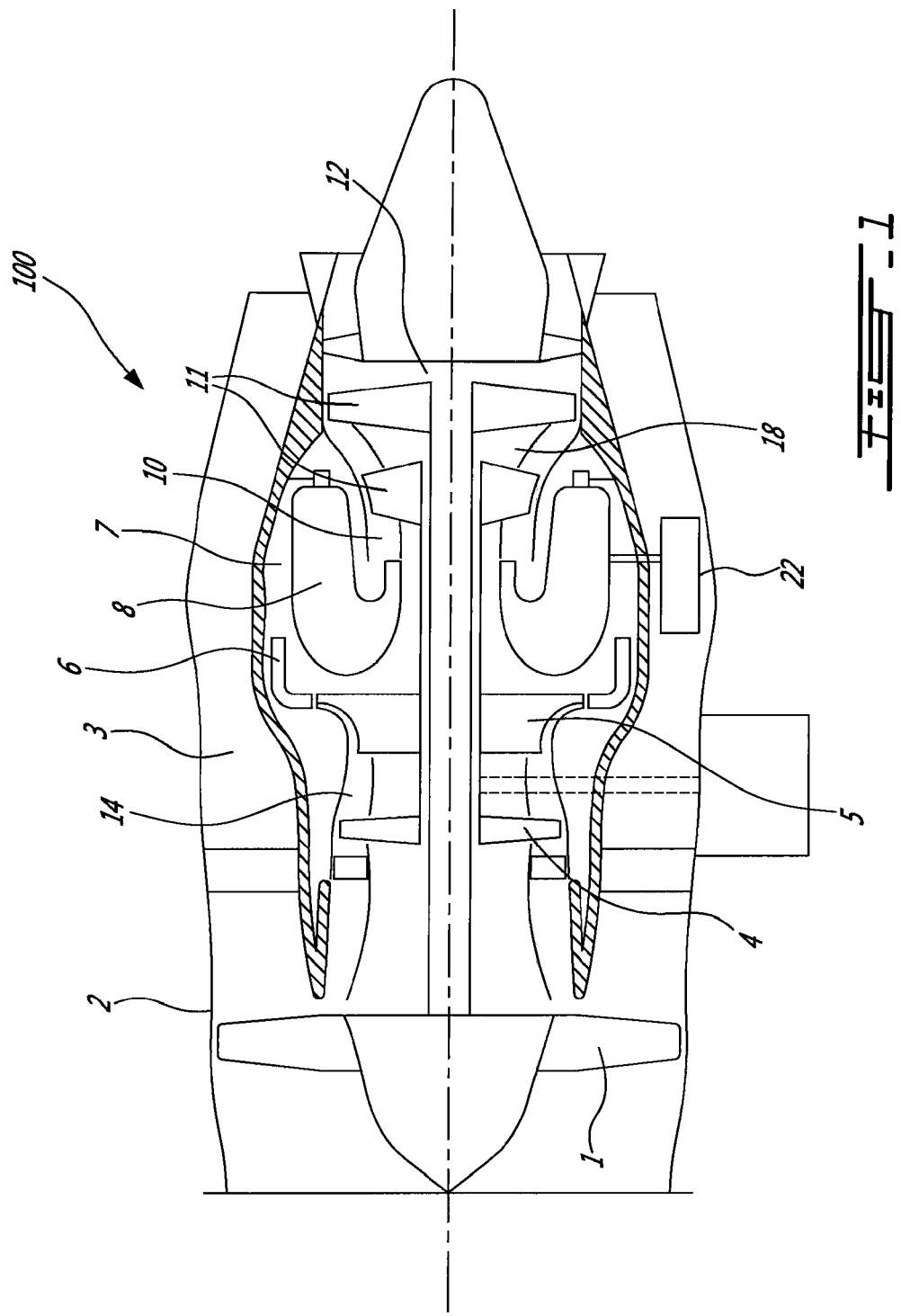
FIG. 1 is an axial cross-sectional view through a turbofan gas turbine engine showing an example of a possible location for probes at an aft end of the low pressure shaft.

FIG. 1 shows an axial cross-section through a gas turbine engine 100. It will be understood that the invention is applicable to any type of engine with a combustor and turbine section such as a turbo-shaft, a turbo-prop, or auxiliary power units. In the embodiment shown, air intake into the engine passes over fan blades 1 in a fan case 2 and is then split into an outer annular flow through the bypass duct 3 and an inner flow through the low-pressure axial compressor 4 and high-pressure centrifugal compressor 5. Compressed air exits the compressor 5 through a diffuser 6 and is contained within a plenum 7 that surrounds the combustor 8. Fuel is supplied to the combustor 8 by fuel pump(s) 22, and is mixed with air from the plenum 7 when sprayed through nozzles into the combustor 8 as a fuel air mixture that is ignited. A portion of the compressed air within the plenum 7 is admitted into the combustor 8 through orifices in the side walls to create a cooling air curtain along the combustor walls or is used for cooling to eventually mix with the hot gases from the combustor and pass over the nozzle guide vane 10 and turbines 11 before exiting the tail of the engine as exhaust.

Figure 4:
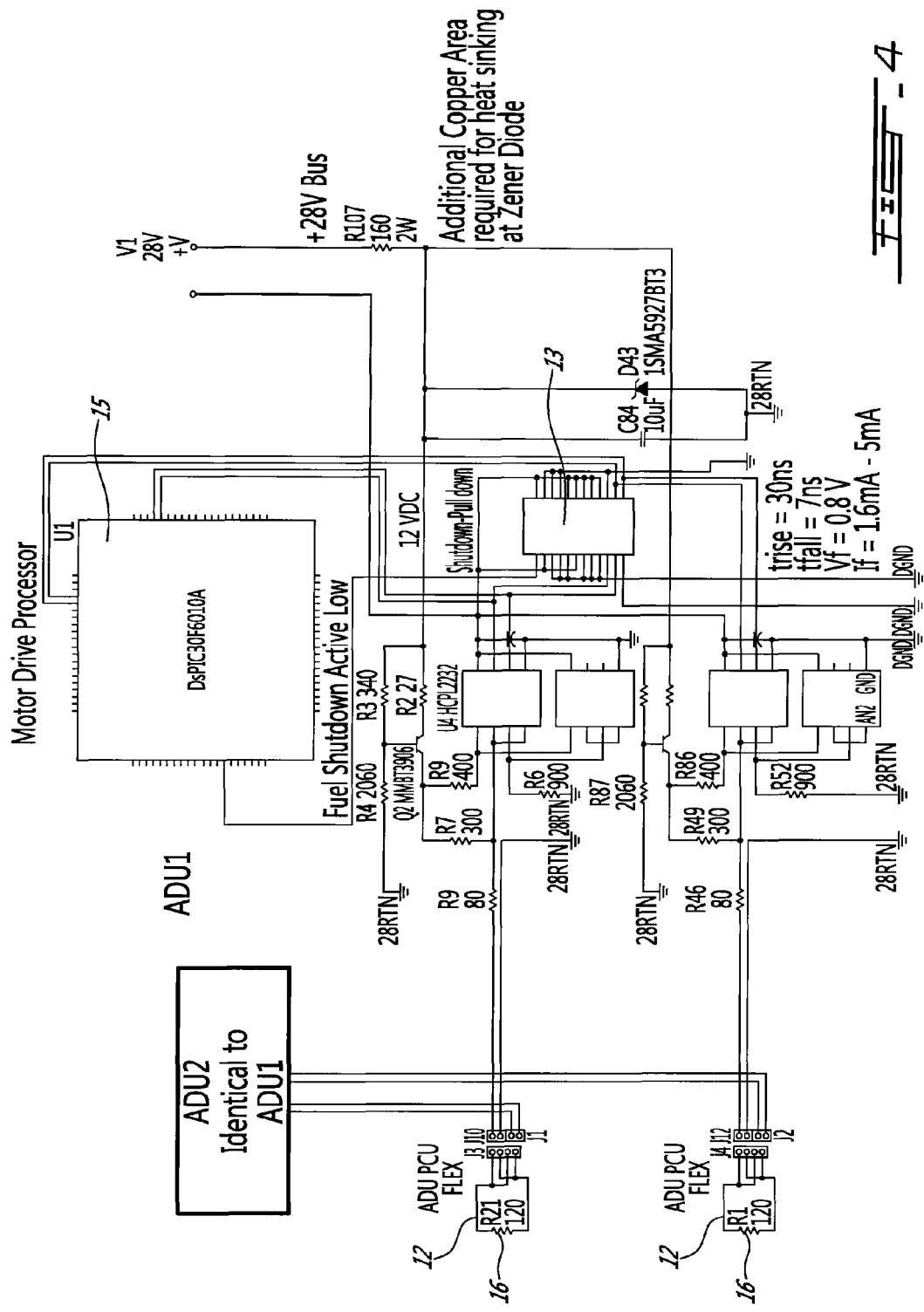
FIG. 4 is a schematic circuit diagram showing two probes, a processor and a motor drive processor.

FIG. 1 shows a possible location of a probe 12 aft of the low pressure shaft to detect rearward movement of the shaft as a result of a shaft shear event such as whole or partial shaft failure. Two probes 12 are used to minimize the number of probes 12 while providing high reliability to distinguish over false detection of shaft shear failures or other conditions. FIG. 3 is a schematic circuit diagram showing two probes 12, a sensor processor 13 and four opto-isolator annunciators 14. FIG. 4 is a schematic circuit diagram showing the two probes 12, the processor 13 and a motor drive processor 15.

The applications describes an electrical control system for distinguishing between an electrical fault and a shaft shear condition in a gas turbine engine as follows. The detection circuit includes two or more probes 12, ideally minimized to only two probes as illustrated. Each probe includes an associated resistor 16 having a predetermined range of resistance, for example approximately 120 Ohms plus or minus an allowable variation.

As shown in FIG. 1, each probe 12 is disposed in the engine rearwardly adjacent the rotary mounted low pressure shaft. In the event of shaft shear or breakage, the aft portion of the broken shaft will move aftward as a result of the un-reacted axial force of the turbine. Axial movement results in mechanical interference between one or both of the plurality of probes 12 and the broken shaft portion.

When two probes 12 are used, it is very unlikely that either of the probes 12 will survive a collision from the shaft and remain intact. The mechanical interference renders the associated resistor 16 in each probe 12 to be ruptured and becomes substantially non-conductive. The loss of a predetermined level of resistance in both probes 12 can be used to determine whether a true shaft shear failure has occurred, since both probes 12 will be damaged by the impact of the shaft portion. When both probes 12 are inoperable, a shaft shear may be diagnosed as the cause and the engine, fuel pump(s) 22, and other system components may be shut down.

In the event that one probe remains operational, with current in the associated circuit encountering the predetermined resistance of the resistor 16, then it is likely that no shaft shear has actually occurred, and that the loss of resistance in the one inoperative probe 12 is attributable to a short circuit in the inoperative probe 12, failure of the inoperative probe 12, or other damage to the circuit connected to the inoperative probe 12.

One or more sensor processors 13 in communication with probe(s) 12 can determine the operational status of each probe 12 based on the presence or absence of the measured resistance to current conducted through each probe 12. When a measured resistance of at least one of the probes 12 is not within a predetermined range of resistance, the sensor processor 13 can generate one of a series of possible applicable fault codes, and cause engine and/or system controller(s) to take appropriate action, as for example indicated in FIG. 2.

In the summary presented in FIG. 2, all possible combinations of the operational condition of an embodiment of a probe circuit are shown. In the illustrated example there are two probes 12, and each probe 12 can have one of four conditions, namely: "R" operational (good condition –120 Ohms predetermined resistance detected within allowable range); "S" short circuit (zero resistance); "O" open circuit (infinite resistance); and "-" circuit damage (resistance detected by above or below predetermined allowable range).

A combination of two probes 12 and four possible conditions results in sixteen possible states i.e.: 4×4 states, numbered 0-15 as shown in FIG. 2. When both probes 12 indicate operation within a predetermined range of resistance "R" (state #15), no fault code is generated. A no-fault code can indicate that no mechanical interference between the shaft and probes 12 has occurred, and that the resistors 16 of each of the two probes 12 remain intact.

When the measured resistance of one probe is not within the predetermined range of resistance and the measured resistance of another probe is within the predetermined range of resistance, these conditions can indicate that no mechanical contact or interference of a major type has occurred and the cause is some type of electrical fault, like a short circuit or probe 12 failure. In such a condition, the fault code generated by the sensor processor 13 can be an "engine warning" code. In such a state the engine would not be shut down automatically, but the pilot or operator of an affected aircraft or other vehicle may be warned that a probe 12 or the associated circuit has malfunctioned. However, one remaining probe 12 continues to operate normally by offering resistance to current at the predetermined range of resistance.

As shown in FIG. 2, a variety of "engine warning" fault codes may be generated when one probe 12 is in good condition while a second probe 12 is not.

When the measured resistance of multiple, or all, probes is not within a predetermined range of resistance, the fault code generated by the sensor processor would be an "engine shutdown" code indicating a shaft failure, configured to cause, directly or indirectly, shutdown of the engine, fuel system, and/or other systems or components, as appropriate. For example, in a two-probe system, whenever both probes 12 indicate that the resistance measured is outside of the predetermined allowable range (e.g., approx. 120 Ohms) then neither probe 12 can be relied on to be operating properly. The exact cause is unknown, however either mechanical impact has occurred or there is an electric malfunction or both. These conditions are considered unacceptable for continued engine operation and an "engine shutdown" fault code is generated.

Four possible operating conditions for each probe system are as follows. When the electrical control system detects that the measured resistance is substantially equal to zero, the sensor processor determines the probe operational status as one of: short circuit; and probe failure that bypasses the resistor 16. When the measured resistance is one of: greater than zero and less than the predetermined range of resistance; and greater than the predetermined range of resistance and less than substantially infinite resistance; the sensor processor determines the probe operational status as: circuit damage. When the measured resistance is substantially infinite, the sensor processor determines the probe operational status as one of: open circuit; and probe failure that prevents current flow.

As shown in FIG. 3, an alternative embodiment includes an electrical control system where the detection circuit includes a fuel shutdown circuit in communication with the sensor processor 13. The shutdown circuit includes a plurality of opto-isolators 14 in communication with the sensor processor 13, for signaling output fault codes to associated displays and equipment controls in an electrically isolated manner.

As shown in FIG. 4, another alternative embodiment includes an electrical control system where the detection circuit includes a motor drive processor 15 in communication with the sensor processor 13. The motor drive processor 15 can control fuel pump(s) 22 and other equipment automatically to rapidly shutdown the gas turbine engine to prevent catastrophic failure. Control of such pumps and/or equipment by a motor drive processor 15 can be accomplished through use of suitably-configured command signals generated by one or more sensor processors, based on assessment of the resistance of one or more of the plurality of shear detection probes. Such signals may be associated with the various operational or failure codes generated by the sensor processor(s) 13 based on determination of the resistances associated with the probe(s) 12.

Figure 5:
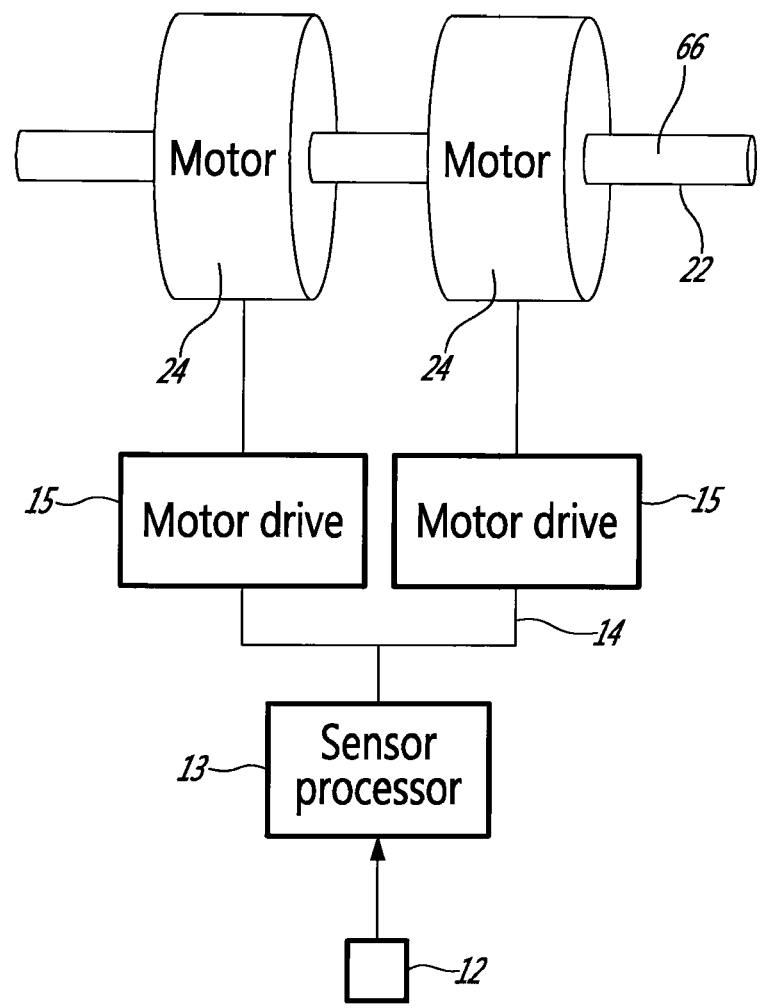
FIGS. 5 and 6 are schematic diagrams of control circuits configured for control of dual motor devices.

An embodiment of an electrical system configured for controlling shutdown of a fuel pump 22 of, for example, a gas turbine 100, using shaft shear detection probe(s) 12 in accordance with, for example, FIG. 4, is shown in FIG. 5. FIG. 5 shows a redundancy arrangement in which two motors 24 are co-mounted on the same fuel pump drive shaft 66, and driven by suitable motor drives 15, each in communication with a system controller 13, and operated as described above and in the incorporated reference. An advantage offered by use of a duel motor arrangement for the pump is that, as described in the incorporated reference, if one motor 24 should fail in a short circuit, open circuit or ground (whether in the motor itself or the drive electronics or lead wires), the drive(s) 15 preferably adjust control of the remaining motor 24 (or motors 24, if there are more than two motors provided in total, and two or more are to remain operational in the event of the shutdown of one) to compensate for the resulting loss in torque, and the failed motor is no longer driven. The controller 13 provides the appropriate control to motor drives 15. As described above, a failed motor is also in effect disconnected, by bringing current flow in its windings to zero, resulting in the impedance of the main phase windings of the failed motor increasing to a high value, as previously described, such that the drag torque due to a short circuit type failure is minimized.

As described herein, in the event of a failure of one or more probe(s) 12, and generation by processor 13 of a corresponding fault code as shown in FIG. 2, suitably-configured fault code signals may be provided to either or both of motor drives 15 to cause shutdown of, for example, both motor 24, and therefore the fuel pump 22.

The sensor and circuit arrangements shown in FIGS. 4 and 5 allow for shut down of either or both of electrical fuel pump drive motors 24 using, for example, a single pair of sensors. Such sensor arrangements, in conjunction with such dual channel electrical architectures, provide continued shaft shear protection even in the event that one of the two sensors have failed or have not failed and or one of the two drives have failed. This can for example be achieved with a single pair of sensors shared between two separated drives.

Figure 6:
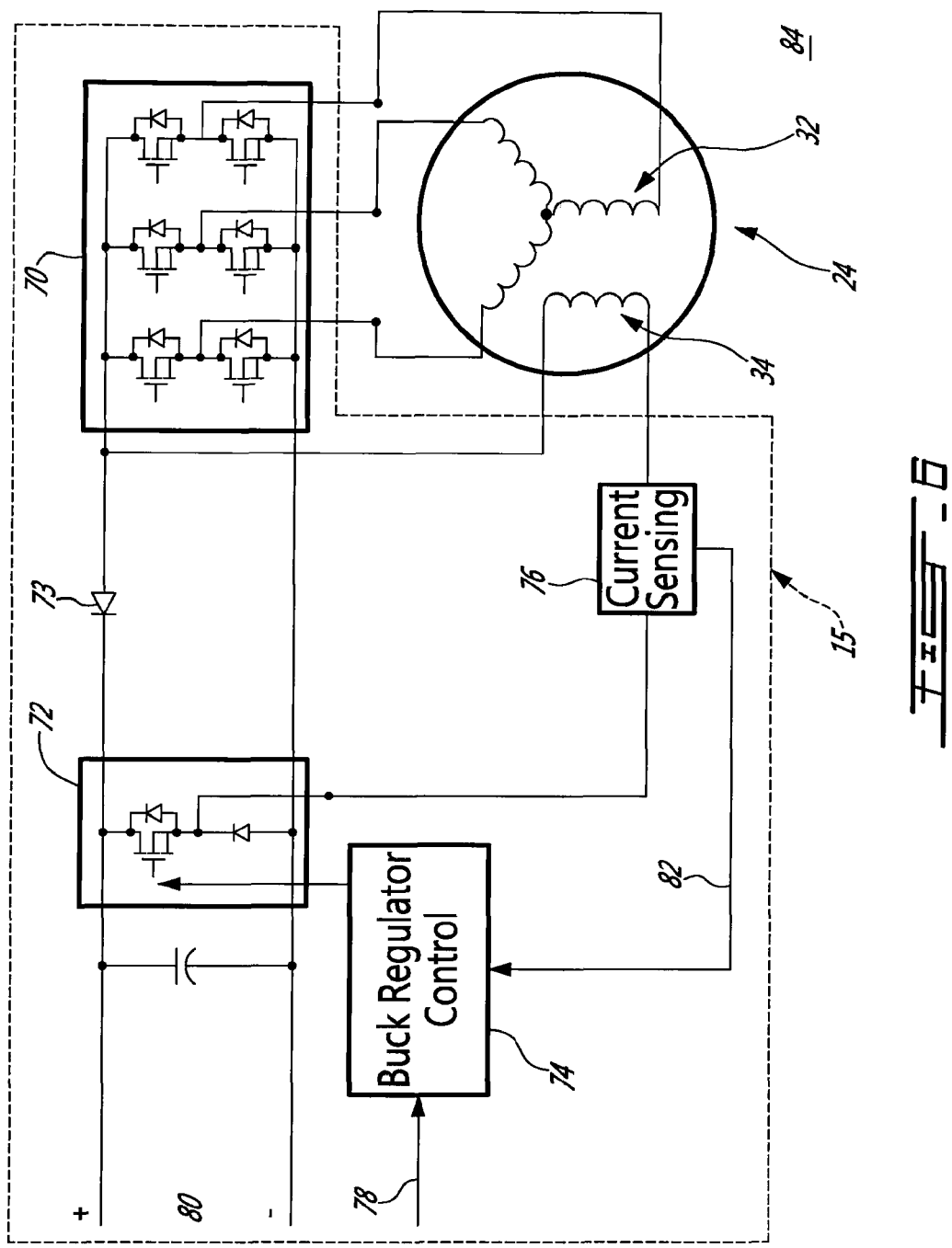

FIG. 6 shows an example of a control scheme for a motor drive 15 for driving a motor 24 in, for example, a dual-motor drive fuel pump 22 such as that shown in FIG. 5. As described in the incorporated reference, motor 24 of FIG. 6 depicts only a single control winding for the 3 phases of its associated phase winding set.

The motor 24 is driven by a motor drive 15, which can as shown comprise a 3-phase H-bridge commutation circuit 70 driving the phase windings 32 of the motor 24. Such a commutation scheme is preferably a six step 120-degree overlapping scheme in a "drake before break" sequence. This sequence in conjunction with a feedback diode 73 can reduce high amplitude voltage spikes occurring at the input of the inverter section of the H-bridge commutation circuit 70 due to the inductive effect of the control winding 34 of a motor 24. Current flow to the motor 24, and thus the motor's torque and speed, can be adjusted using a suitable pulse width modulated supply system or "buck regulator" circuit 72 connected to control winding 24 of the motor 10. The buck regulator may be any suitable circuit. The skilled reader will appreciate that buck regulators typically require a filter inductor as an energy storage device for stepping down the voltage level. In such a configuration, the buck regulator 72 uses the control winding(s) 24 as its inductor, thus eliminating the need for an additional inductor, and consequently reducing the weight of the buck regulator 72. This filter inductor replacement role of the control winding may dictate design features of the control winding, as the designer will consider the buck regulator requirements as well as the motor requirements in providing a suitable control winding configuration. The output of the control winding 24 is connected to the inverter section of the H-bridge commutation circuits 70, such that a DC-current in the control winding 24 becomes AC current to the phase windings 22 of the motor 10.

A feedback 82 of the drive current level is provided to a buck regulator controller 74 using a current sensor 76. The buck regulator and controller may be of any suitable type, including types well-known to the skilled reader which need not be discussed further here.

In use, the buck regulator 72 varies the current flow to the phase windings 32 of the motor 24, and thus controls the torque and speed of the motor 24, based on an input torque/speed request 78, such as a fault code signal, received from system controller 15. Current is provided from a DC source 80 to the phase windings 22, via the control winding 24, as already described.

Referring again to FIG. 5, in a dual motor arrangement for a fuel pump or other component, both motors 24 and their associated controllers 15 may be arranged as described with reference to FIG. 6, to provide a dual-redundant motor system. To enhance redundancy protection, preferably separate DC sources 80 are provided for each motor system.

In a normal operation mode of dual motors 24 in such an arrangement, the drive 15 to each motor 10 is adjusted so that the motors contribute in desired proportions to the torque delivered to shaft 66, and the shaft rotates at a desired speed to drive the fuel pump 22, as instructed by system controller 13. Both motors 24 are preferably driven and/or in appropriate conditions shut down concurrently to provide torque or stop fuel flow. When a higher efficiency operation or higher power operation is desired, the respective drives 15 can be adjusted accordingly to adjust the contribution proportion of each motor 24.

Further details of operation of such a dual redundant system according to FIGS. 5 and 6 are provided in the incorporated reference.

Thus, as summarized in FIG. 2, in some embodiments the engine electrical control system includes preferably only two probes 12, wherein each probe 12 is measured to determine its resistance and determine the probe operational status selected from: "R" no-fault; "S" short circuit; "O" open circuit; and "-" circuit damage. Four opto-isolators 14 signal the status receiving communication from the sensor processor 13 or optionally a motor drive processor 15 is employed.

Although the above description relates to a specific preferred embodiment as presently contemplated by the inventor, it will be understood that the invention in its broad aspect includes mechanical and functional equivalents of the elements described herein.

We claim:

1. A circuit useful for distinguishing between an electrical fault and a shaft shear failure in a gas turbine engine, the circuit comprising:

a plurality of probes, each probe associated with a respective resistor having a predetermined range of resistance, and each probe being disposed in an engine adjacent a rotary mounted shaft component, whereby mechanical interference between any of the plurality of probes and the shaft component renders the corresponding associated resistor substantially non-conductive; and at least one sensor processor configured to determine an operational status of each probe, based on a measured resistance to current conducted through each probe, and to generate a fault code when the measured resistance associated with at least one of the plurality of probes is not within the predetermined range of resistance;

wherein the fault code generated by the at least one sensor processor is indicative of a shaft shear failure when the measured resistance to current conducted through each of the plurality of probes is substantially infinite;

wherein:
when the measured resistance associated with at least one probe is not within the predetermined range of resistance; and
when the measured resistance associated with at least one other probe is within the corresponding predetermined range of resistance;
the fault code generated by the sensor processor is an engine warning code.

2. The circuit of claim 1 wherein:
when the measured resistance associated each of the plurality of probes is not within the corresponding predetermined ranges of resistance;
the fault code generated by the sensor processor is an engine shutdown code.

3. The circuit of claim 1 wherein when the measured resistance is substantially equal to zero, the sensor processor determines the probe operational status as one of: short circuit and probe failure.

4. The circuit of claim 1 wherein
when the measured resistance is one of: greater than zero and less than the corresponding predetermined range of resistance; and greater than the corresponding predetermined range of resistance and less than substantially infinite resistance;
the sensor processor determines the probe operational status as: circuit damage.

5. The circuit of claim 1 wherein when a measured resistance is substantially infinite, the sensor processor determines a probe operational status as one of: open circuit; and probe failure.

6. The circuit of claim 1, comprising a motor drive processor in communication with the at least one sensor processor.

7. The circuit of claim 1, comprising a fuel shutdown circuit in communication with the at least one sensor processor.

8. The circuit of claim 7, wherein the fuel shutdown circuit provides for shutdown of a fuel pump comprising a plurality of drive motors.

9. The circuit of claim 1, comprising at least one opto-isolator in communication with the at least one sensor processor.

10. The circuit of claim 9, comprising four opto-isolators in communication with the at least one sensor processor.

11. The circuit of claim 1 comprising two probes.

12. The circuit of claim 11 wherein each probe is associable by the at least one sensor processor with a probe operational status selected from the group consisting of: no-fault; short circuit; open circuit; and circuit damage.

13. A turbine engine comprising a circuit useful for distinguishing between an electrical fault and a shaft shear failure in a gas turbine engine, the circuit comprising:
a plurality of probes, each probe associated with a respective resistor having a predetermined range of resistance, and each probe being disposed in an engine adjacent a rotary mounted shaft component, whereby mechanical interference between any of the plurality of probes and the shaft component renders the corresponding associated resistor substantially non-conductive; and
at least one sensor processor configured to determine an operational status of each probe, based on a measured resistance to current conducted through each probe, and to generate a fault code when the measured resistance associated with at least one of the plurality of probes is not within the predetermined range of resistance;
wherein the fault code generated by the at least one sensor processor is indicative of a shaft shear failure when the measured resistance to current conducted through each of the plurality of probes is substantially infinite;
wherein:
when the measured resistance associated with at least one probe is not within the predetermined range of resistance; and
when the measured resistance associated with at least one other probe is within the corresponding predetermined range of resistance;
the fault code generated by the sensor processor is an engine warning code.

14. A method of monitoring shaft shear failure in a gas turbine engine, the method performed by one or more processors, each processor communicatively linked with at least one of a plurality of probes, each probe comprising a respective resistor and being configured to provide a substantially open circuit in the event of a whole or partial shaft shear failure; the method comprising:
comparing a measured resistance of each of the plurality of probes with a corresponding predetermined range of resistance; and
generating a fault code when at least one of the measured resistances associated with at least one of the plurality of probes is not within the corresponding predetermined range of resistance;
wherein the fault code generated is indicative of a shaft shear failure when the measured resistance to current conducted through each of the plurality of probes is substantially infinite;
wherein:
when the measured resistance of at least one probe is not within the predetermined range of resistance; and
when the measured resistance of at least one other probe is within the corresponding predetermined range of resistance,
generating an engine warning code.

15. The method of claim 14, comprising: when the measured resistance of each of the plurality of probes is not within the corresponding predetermined ranges of resistance, generating an engine shutdown code.

16. The method of claim 14, comprising: when the measured resistance of at least one of the probes is substantially equal to zero, generating at least one of a short circuit code and a probe failure.

17. The method of claim 14, comprising,
when the measured resistance of at least one of the plurality of probes is one of: greater than zero and less than the corresponding predetermined range of resistance; and greater than the corresponding predetermined range of resistance and less than substantially infinite resistance;
generating a circuit damage code.

18. The method of claim 14, comprising, based on the comparing a measured resistance of each of the plurality of probes with a corresponding predetermined range of resistance: providing to a motor drive processor communicatively linked to the at least one processor a control signal.

19. The method of claim 18, wherein the control signal comprises a signal adapted to cause shutdown of a fuel system.

20. The method of claim 19, wherein the fuel system comprises a fuel pump driven by a plurality of motors.

* * * * *